PARALLEL CAPACITOR CONTROLLED VARIABLE FREQUENCY OSCILLATOR
Filed Nov. 29, 1962
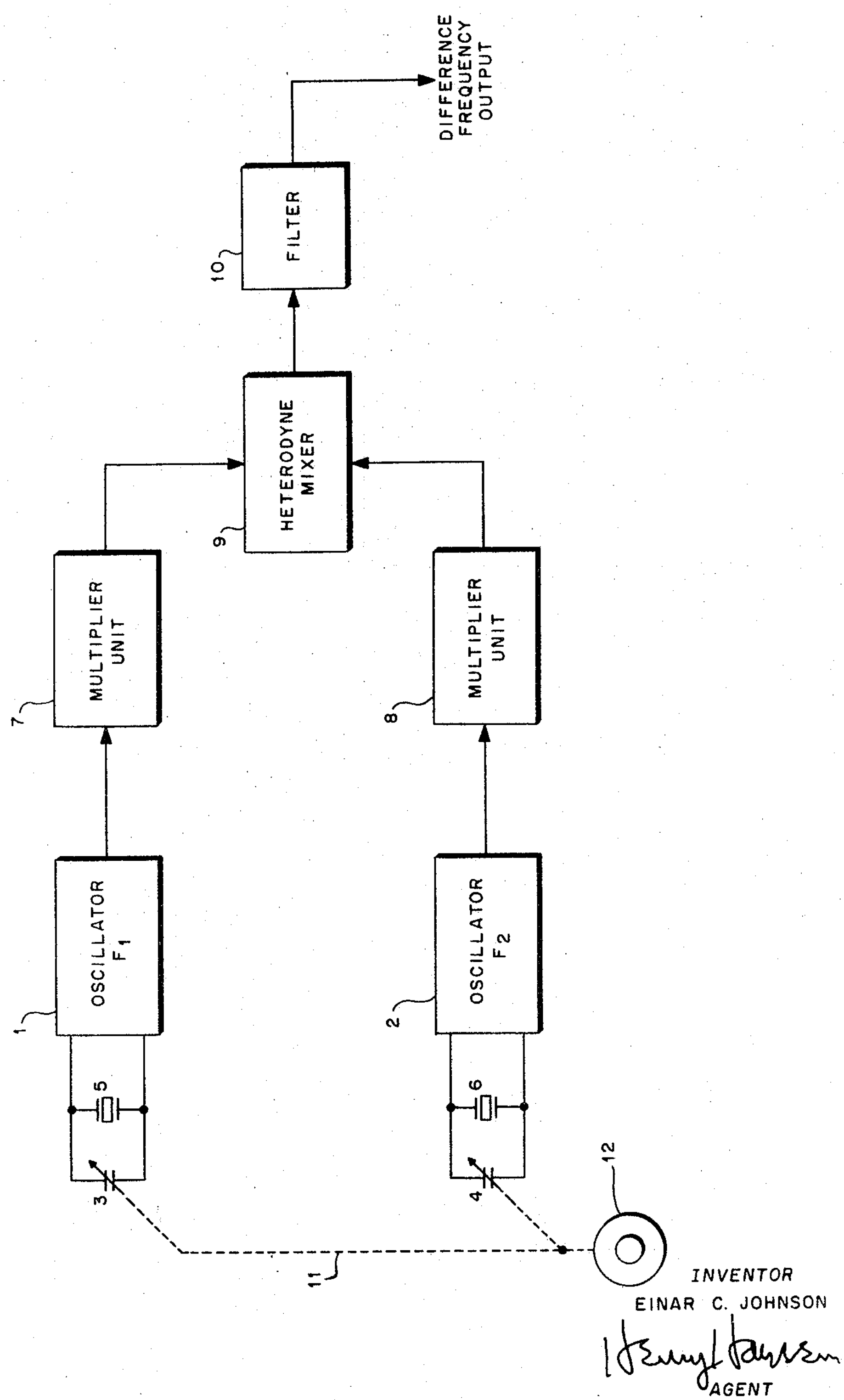
INVENTOR
EINAR C. JOHNSON
AGENT United States Patent Office 3,296,549
Patented Jan. 3, 1967

3,296,549
PARALLEL CAPACITOR CONTROLLED VARIABLE FREQUENCY OSCILLATOR

Einar C. Johnson, Hatboro, Pa., assignor to the United States of America as represented by the Secretary of the Navy Filed Nov. 29, 1962, Ser. No. 241,082
1 Claim. (Cl. 331—40)

The invention described herein may be manufactured and used by or for the Government of the United States of America for governmental purposes without the payment of any royalties thereon or therefor.

This invention relates to a signal generator and more particularly to a variable frequency signal generator having high stability over a wide range of frequencies.

The various signal generators in use today may be classified into two large groups. The first group consists of the heterodyne signal generator wherein the signal frequencies of two oscillators are combined to provide an output frequency which has a range equal to the range in frequency through which one of the oscillators may be varied. A major disadvantage of this type of device is its low stability which is of the order of ±1 percent.

The other large grouping into which signal generators fall is the resistance-capacitance signal generator. This type of signal generator is a discrete frequency signal generator and also has a low stability of ±1 percent. Another disadvantage of this type of signal generator is the distortion which is present in the output wave. This distortion is attributed to the particular type of amplifier which must be employed with this type of signal generator since the required amplifier normally must display a nonlinearity in order to operate advantageously.

The present invention eliminates the above discussed disadvantages by employing two highway stable quartz crystal controlled radio frequency oscillators in unique combination to provide a frequency signal generator which has an output signal frequency variable over a range of frequencies many times greater than the particular range of frequencies through which either of the radio frequency oscillators may be varied while at the same time providing high stability in the frequency output and low distortion in the output waveform.

The present invention contemplates a variable frequency signal generator which employs two crystal controlled oscillators in such an arrangement that the frequency of the one oscillator may be increased while the frequency of the other oscillator is caused to decrease.

In accordance with the present invention two quartz crystal controlled oscillators are used in combination with a pair of multiplier units in a heterodyne scheme to provide a signal frequency generator. The frequency of each oscillator is varied by a capacitor across the quartz crystal of each oscillator in such a manner that the capacitance of each capacitor may be varied together by means of a common shaft but in opposite directions, that is, as the capacitance of one capacitor is caused to increase, the capacitance of the other capacitor is caused to decrease an equal amount. By varying the output of each oscillator in this manner and directly multiplying these outputs before heterodyning a signal generator is provided which may be varied between zero and 200,000 cycles per second which is at least equivalent in range to the conventional heterodyne signal generators and the resistance-capacitance signal generator. However, the unique combination of the present invention provides a signal generator which has a stability greater by several orders of magnitude than conventional signal generators now in use. This high stability is achieved without any increase in cost of construction over the conventional types.

Another important advantage of the present invention is that it is relatively unaffected by variations in power supply voltage, ambient temperature, or other effects which are common to crystal controlled oscillators since these variations produce substantially equal changes in the frequency of both crystal controlled oscillators. Thus, even after multiplication such variations will normally cancel out.

Therefore, it is an object of the present invention to provide a signal generator of extremely high stability.

Another object of the present invention is to provide a signal generator employing quartz crystal control of frequency which is variable from zero through a very wide range of frequencies.

Yet another object of the present invention is to provide a variable frequency signal generator having a low distortion output wave and a stability substantially greater than that of signal generators presently available.

A further object of the present invention is to provide a high stability variable frequency signal generator whose output waveform is virtually unaffected by variations in power supply voltage, ambient temperature and the like.

A still further object of the present invention is to provide a signal generator having crystal stability which may be tuned from zero to any desired frequency or which is tunable over any desired specified portion of the frequency spectrum which has a stability comparable with present fixed frequency sources.

Other objects and many of the attendant advantages of this invention will be readily appreciated as the same becomes better understood by reference to the following detailed description when considered in connection with the accompanying drawing.

The figure illustrates partly in schematic and partly in block diagram form the preferred embodiment of the invention.

Referring now more particularly to the figure, there are shown quarty crystal controlled radio frequency oscillators 1 and 2. Quartz crystals 5 and 6 are shown connected across oscillators 1 and 2, respectively. Variable capacitors 3 and 4 are connected across quartz crystals 5 and 6, respectively. The rotors of capacitors 3 and 4 are commonly connected for rotation by shaft 11. The rotors of capacitors 3 and 4 are physically 180 degrees apart so that as the shaft 11 is rotated as by turning knob 12, one capacitor, for example, capacitor 3, will increase in capacitance while the other capacitor, for example, capacitor 4, will decrease in capacitance. Thus, the frequency of one oscillator may be caused to increase while at the same time the frequency of the other oscillator is caused to decrease.

The outputs of oscillators 1 and 2 are fed into multiplier units 7 and 8. Multiplier units 7 and 8 are conventional and each may consist of a multiplicity of frequency multipliers in cascade. Thus, each of the frequencies generated by the oscillators 1 and 2 may be multiplied by any factor desired.

The outputs of multiplier units 7 and 8 are fed into and combined in a heterodyne mixer 9 whose output is a frequency equal to the difference between the frequency outputs of oscillators 1 and 2 after multiplication by multiplier units 7 and 8. The output of heterodyne mixer 9 is fed into filter 10 which selects only the desired difference frequency from among the various frequencies at the output of heterodyne mixer 9.

The present invention may be best understood from a description of the operation for a specific case which follows. Capacitors 3 and 4 are initially set so that the capacitance of caupacitor 3 is at its minimum capacitance while the capacitance of capacitor 4 is at its maximum capacitance. For this situation, the frequency generated by oscillator 1 will be at a first value $F_1$ while the frequency generated by oscillator 2 will be at a second value $F_2-F$, where F is the shift in frequency caused by changing from minimum to maximum capacitance of the variable capacitor 4. For purposes of explanation it is assumed that frequency F is equal to one kilocycle per second and that the multiplication factor N of each of the multiplier units 7 and 8 is 100. Thus, in the initial state the frequency generated by each of the oscillators 1 and 2 is equal. This is true although the two crystal oscillator frequencies would normally be one kilocycle per second apart in the spectrum because oscillator 2 has been lowered in frequency by the presence of maximum capacitance in capacitor 4 to the same frequency generated by oscillator 1. Thus, even after multiplication the difference frequency at the output of filter 10 will be zero.

However, when shaft 11 is rotated by means of knob 12 to its opposite extreme, it is seen that capacitor 3 is then at maximum capacitance while capacitor 4 is at minimum capacitance. This condition results in the frequency of oscillator 1 decreasing by one kilocycle per second and the frequency of oscillator 2 increasing by one kilocycle per second. Thus, at this point the difference in frequency between the oscillators 1 and 2 equals 2F. Since each of the frequency outputs from oscillators 1 and 2 are multiplied by a factor of 100 by multiplier units 7 and 8, respectively, the difference frequency available will be 2NF or 200 kilocycles per second. Thus, by varying capacitors 3 and 4 from one extreme to the other, the output frequency of the signal generator of the present invention is varied from zero to 200,000 cycles per second. By choosing higher multiplication factors in each of the multiplier units 7 and 8 this range of variation may be increased in an almost limited manner.

Since variations in power supply voltage, ambient temperature produce substantially equal changes in the frequency or both of the crystal controlled oscillators 1 and 2, frequency drift due to these effects is substantially eliminated due to the fact of the natural tendency of this device to cancel out such variations.

By utilizing crystal ovens using proportional control of the temperature, optimum quartz crystal cut, and power supply voltage regulation the stability of the signal generator of the present invention may be further enhanced. A single oven may be used to house both quartz crystals 5 and 6 and capacitors 3 and 4 to maintain the quartz crystals at the most efficient temperature and humidity. A single oven is possible because even very slight changes in temperature and humidity within the oven tend to affect both oscillators identically and cancel the effect of these slight changes.

By making use of the principles of the present invention construction of a signal generator having a stability several times greater than that possessed by standard equipment now available at a comparable cost is possible.

By proper selection of the quartz crystal frequencies and of the multiplication factor, construction of a signal generator having crystal stability and tunable from zero to any desired frequency is possible. Similarly, a signal generator which is tunable over any specified portion of the spectrum is possible in the light of the above disclosure.

Obviously, many modifications and variations of the present invention are possible in the light of the above teachings. It is, therefore, to be understood that within the scope of the appended claim the invention may be practiced otherwise than as specifically described.

What is claimed is:

A variable signal generator, comprising in combination:
first oscillator means controlled by a first crystal,
second oscillator means controlled by a second crystal,
capacitor means connected in parallel with each of said crystals for simultaneously increasing the output frequency of said first oscillator means from a first value to a second value and decreasing the output frequency of said second oscillator means from said first value to a third value,
first multiplier means connected to said first oscillator means multiplying the output frequency thereof by a predetermined factor,
second multiplier means connected to said second oscillator means multiplying the output frequency thereof by said predetermined factor,
mixer means connected to said first and second multiplier means providing an output equal to the difference in frequencies between the outputs of said first and second multiplier means.

References Cited by the Examiner

UNITED STATES PATENTS

| | | | |
|---|---|---|---|
| 2,058,559 | 3/1933 | Braaten | 331—158 X |
| 2,240,452 | 4/1941 | Wolfskill | 331—40 |
| 2,790,079 | 4/1957 | Dodington | 331—40 |
| 2,816,229 | 12/1957 | Vantine | 331—40 |

FOREIGN PATENTS

| | | |
|---|---|---|
| 162,988 | 5/1955 | Australia. |

OTHER REFERENCES

Article by Jennings in QST in February 1956, pages 36, 37, 116.

ROY LAKE, *Primary Examiner.*

J. KOMINSKI, *Assistant Examiner.*